United States Patent [19]

Bradford

[11] Patent Number: 5,717,327
[45] Date of Patent: Feb. 10, 1998

[54] CURRENT SENSOR

[76] Inventor: Melvin J. Bradford, Rural Route 4, Roseneath, Ontario, Canada, K0K 2X0

[21] Appl. No.: 532,408

[22] Filed: Sep. 22, 1995

[51] Int. Cl.[6] .......................... G01R 21/08; G01R 19/00
[52] U.S. Cl. ........................ 324/142; 324/117 R
[58] Field of Search ........................ 324/142, 115, 324/127, 117 R

[56] References Cited

U.S. PATENT DOCUMENTS

| | | | |
|---|---|---|---|
| 3,372,334 | 3/1968 | Fenoglio et al. | 324/127 |
| 3,593,118 | 7/1971 | Chaney et al. | 324/115 |
| 3,649,912 | 3/1972 | Nakamura | 324/127 |
| 4,182,982 | 1/1980 | Wolf et al. | 324/127 |
| 4,309,655 | 1/1982 | Lienhard | 324/117 |
| 4,385,273 | 5/1983 | Lienhard | 324/117 |
| 4,500,838 | 2/1985 | Bloomer | 324/117 |
| 4,504,787 | 3/1985 | Planer | 324/142 |
| 4,506,214 | 3/1985 | Lienhard | 324/117 |
| 4,520,311 | 5/1985 | Petr | 324/117 |
| 4,525,668 | 6/1985 | Lienhard | 324/142 |
| 4,596,950 | 6/1986 | Lienhard | 324/117 |
| 5,307,226 | 4/1994 | Brug | 360/113 |

FOREIGN PATENT DOCUMENTS

| | | |
|---|---|---|
| 0300635 | 1/1989 | European Pat. Off. |
| 57-67865 | 4/1982 | Japan |
| 2-170061 | 6/1990 | Japan |

OTHER PUBLICATIONS

"Magnetoresistive Current Sensor", A.J. Bowen et al, IBM Technical Disclosure Bulletin, vol. 17, No. 3, Aug. 1974.

"Dual Slope Magnetoresistive Current Sensor", J.S. Feng, IBM Technical Disclosure Bulletin, vol. 20, No. 2, Aug. 1977.

*Primary Examiner*—Ernest F. Karlsen
*Attorney, Agent, or Firm*—Baker & Daniels

[57] ABSTRACT

A current sensor includes a current carrying bus bar configured to define a pair of electrically parallel current carrying paths each having a different cross-sectional area. A sensing device is associated with each of the current carrying paths. One of the sensing devices is associated with a smaller of the current carrying paths and is sensitive to current flow through the bus bar below a threshold level. The other sensing device is associated with a larger of the current carrying paths and is sensitive to current flow through the bus bar above the threshold level. The sensing devices generate output upon detection of current flow through the bus bar. Sensor signal processing means is responsive to the sensing devices and generates output proportional to current flow through the bus bar.

22 Claims, 4 Drawing Sheets

CURRENT SENSOR

FIELD OF THE INVENTION

The present invention relates to sensors and in particular to a current sensor to measure the current flowing through a conductor and to an electrical power usage meter incorporating a current sensor.

BACKGROUND OF THE INVENTION

Meters to measure electrical power usage are well known and many different designs have been considered. For example, U.S. Pat. No. 4,902,965 to Bodrug et al. discloses a meter to monitor electrical power usage separately over different periods during the day so that different rates can be charged for power consumption depending on the time of day the electrical power is consumed.

In meters of this type, in order to measure accurately the electrical power usage, it is necessary to measure accurately the current flow as well as the line voltage. Many different current sensors have been considered to measure current flow. For example, U.S. Pat. Nos. 4,309,655 and 4,506,214 to Lienhard et al. disclose current measuring devices which include an anisotropic magnetic film disposed on a magnetic core. The current measuring devices are positioned near a current carrying conductor to detect current flow through the conductor. In one embodiment, a current divider in the form of a bus bar having a cut in it to define main and shunt paths for the current is used. The main and shunt paths bulge out in opposite directions to define an eye in which the magnetic core is placed. In another embodiment, the shunt path forms a loop to one side of the main path to define a space to accommodate the magnetic core.

Japanese Patent No. 57-67865 to Yushimitsu discloses current detectors for detecting current flow in both a shunt path and a main path. The output of the current detectors are used to generate an output voltage proportional to the current flow in both paths.

Although these devices allow current measurements to be made, improved designs to measure more accurately current flow through a conductor are continually being sought. It is therefore an object of the present invention to provide a novel current sensor and an electrical power usage meter incorporating a current sensor.

SUMMARY OF THE INVENTION

According to one aspect of the present invention there is provided a current sensor comprising:

at least two electrically parallel current carrying paths, each of said current carrying paths having a different cross-sectional area so that current flow through said paths is different;

a sensor associated with each of said current carrying paths to detect the flow of current therethrough; and sensor signal processing means associated with said sensors and receiving output therefrom, said sensor signal processing means generating output proportional to the current flow through said paths using the output of one of said sensors when current flow through a larger of said current carrying paths is below a threshold level.

According to another aspect of the present invention there is provided a current sensor comprising:

a current carrying bus bar to be connected in series with an input electrical power source, said bus bar being configured to define at least two electrically parallel current carrying paths each having a different cross-sectional area;

a sensing device associated with each of said current carrying paths, one of said sensing devices being associated with a smaller of said current carrying paths and being sensitive to current flow through said bus bar below a threshold level, another of said sensing devices being associated with a larger of said current carrying paths and being sensitive to current flow through said bus bar above said threshold level, said sensing devices generating output upon detection of current flow through said bus bar; and sensor signal processing means responsive to the output of said sensing devices and generating output proportional to current flow through said bus bar.

According to yet another aspect of the present invention there is provided an electrical power usage meter comprising:

a current sensor to measure current flow through supply power lines, said current sensor including at least two electrically parallel current carrying paths to be electrically connected in series with said supply power lines, each of said current carrying paths having a different cross-sectional area so that current flow through said paths is different; a sensing device associated with each of said current carrying paths to detect the flow of current therethrough; and sensor signal processing means associated with said sensing devices and receiving output therefrom, said sensor signal processing means generating output proportional to the current flow through said paths using the output of one of said sensing devices when current flow through a larger of said current carrying paths is below a threshold level;

a voltage sensor to measure the voltage on said conductor; and logic means responsive to the current and voltage sensors to generate output representative of the electrical power usage.

Preferably, the sensor signal processing means uses the output of the other of the sensors to generate the output when the current flow through the larger of the current carrying paths is above the threshold level. It is also preferred that the sensors are in the form of magneto-resistive devices.

In one embodiment, the current carrying paths are defined by a conductor configured to define the paths. Specifically, the paths are defined by a slot extending through the conductor which is generally parallel to but offset from the central longitudinal axis of the conductor. Recesses are formed in each current carrying path to accommodate the sensors.

Preferably, the sensor signal processing means includes a current sensing circuit associated with each of the sensors and switch means to connect the sensing circuit associated with the smaller current carrying path to an output node when current flow through the larger current carrying path is below the threshold level and to connect the sensing circuit associated with the larger current carrying path to the output node when current flow through the larger current carrying path reaches the threshold level. In one embodiment, the processing means includes a peak detector coupled to the smaller current carrying path and actuating the switch means when current flow through the larger current carrying path reaches the threshold level.

The present invention provides advantages in that it allows accurate current measurements to be made while minimizing circuit complexity.

BRIEF DESCRIPTION OF THE DRAWINGS

An embodiment of the present invention will now be described more fully with reference to the accompanying drawings in which.

DESCRIPTION OF THE PREFERRED EMBODIMENT

Figure 1:
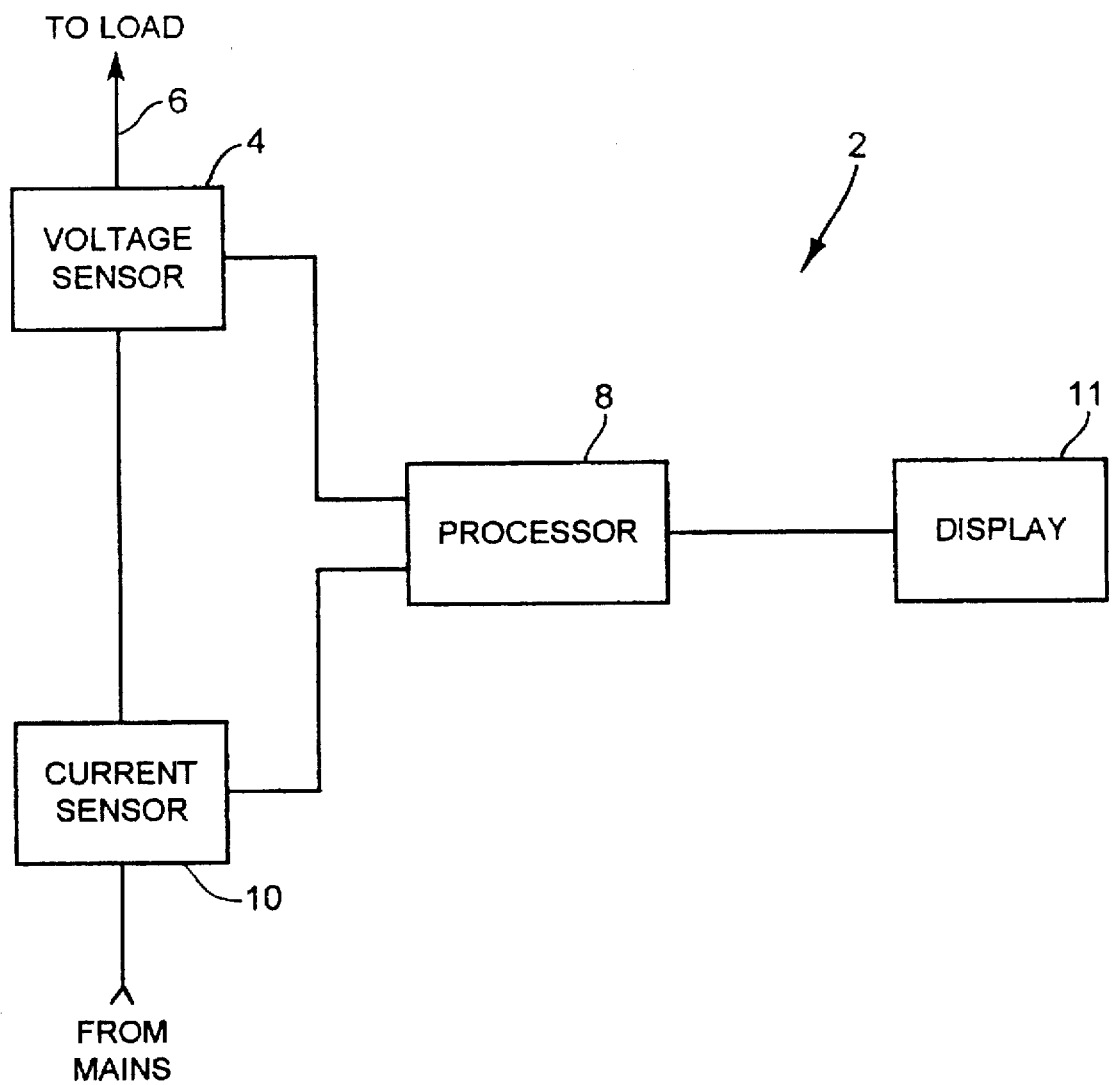
FIG. 1 is a schematic of an electrical power usage meter.

Referring now to FIG. 1, an electrical power usage meter is shown and is generally indicated by reference numeral 2. Meter 2 is preferably of the type disclosed in U.S. Pat. No. 4,902,965 to Bodrug et al., the contents of which are incorporated herein by reference. As can be seen, meter 2 includes a voltage sensor 4 to measure the line voltage on power supply line 6. A processor 8 receives the output of the voltage sensor 4 as well as the output of a current sensor 10. Current sensor 10 measures the current flow along the supply power line 6. The processor 8 includes logic to calculate the electrical power usage based on the output of sensors 4 and 10 respectively and stores the calculated power usage in memory. Thus, consumed electrical power can be accurately measured and stored on a daily basis. The processor 8 also is designed to partition a day into selected time periods and to store consumed electrical power usage measurements separately for each selected period so that different rates can be charged for consumed electrical power depending on the time of day the electrical power is consumed. A display 11 allows the total consumed power to be visually determined. Although, not shown, the meter 2 allows the measurements stored in memory to be downloaded to a remote site over telephone lines.

Figures 2A, 2B:
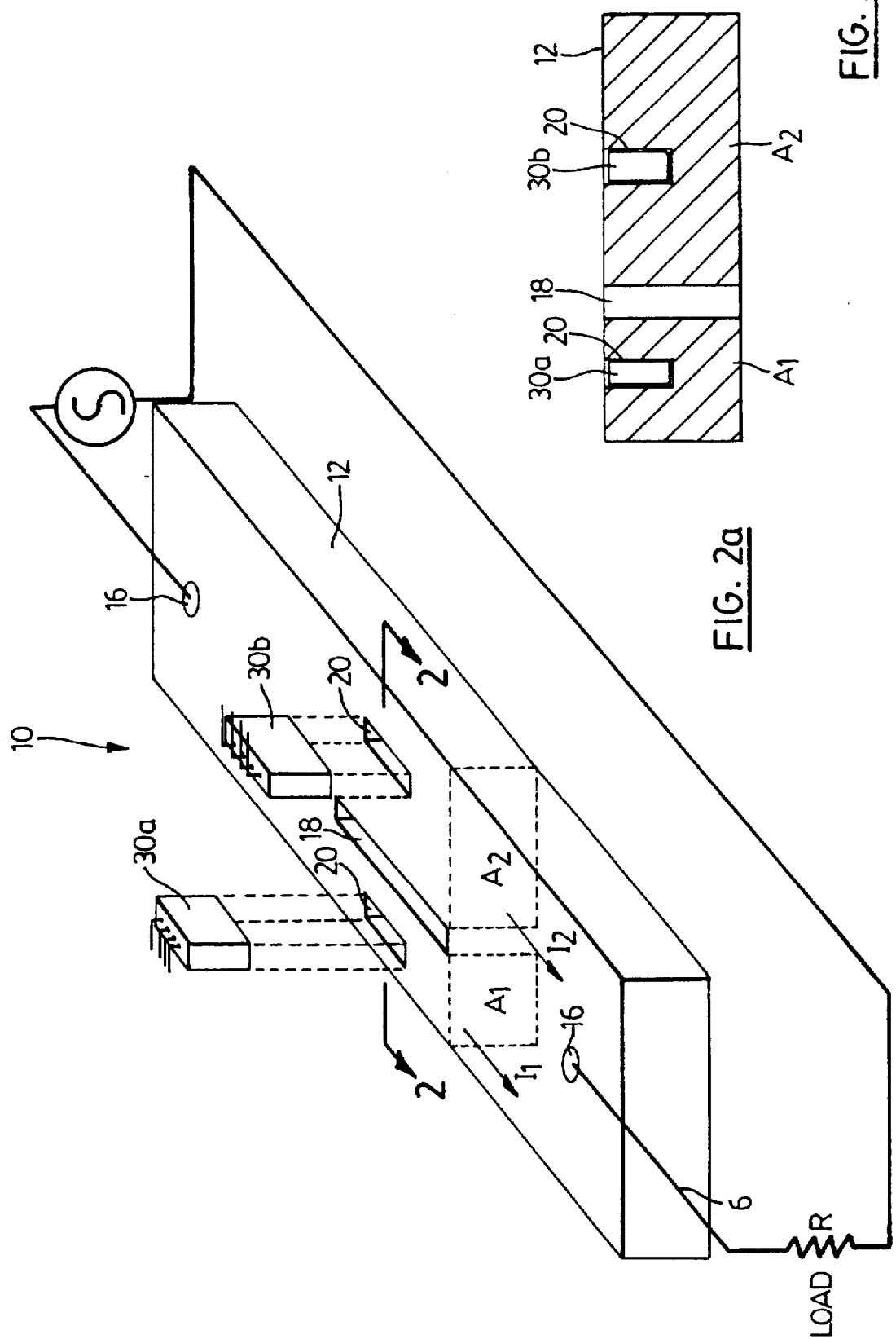
FIG. 2a is a schematic of a current carrying bus bar defining a pair of electrically parallel current carrying paths forming part of a current sensor in accordance with the present invention.
FIG. 2b is a cross-sectional view of FIG. 2a taken along line 2—2.
Figure 3:
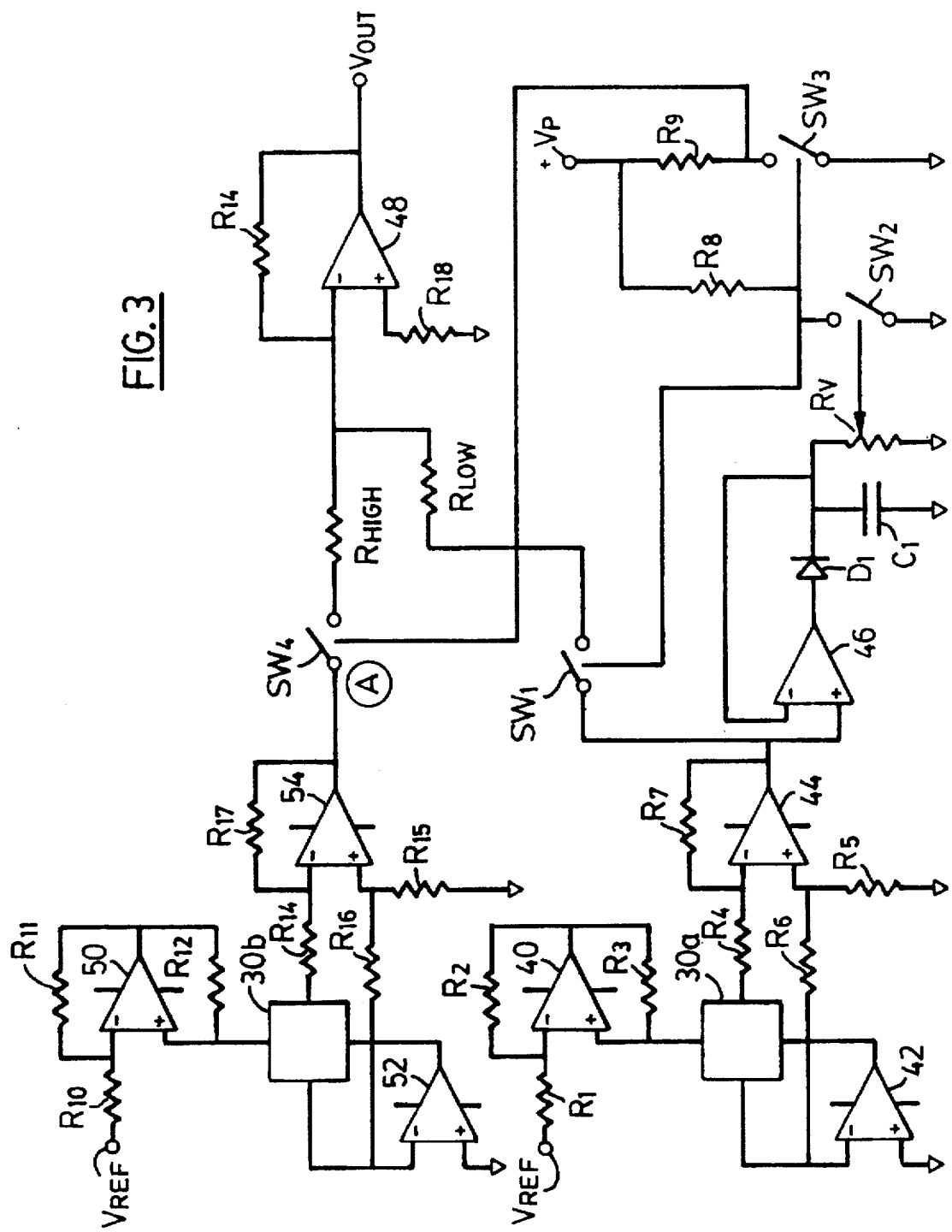
FIG. 3 is a schematic diagram of the current sensor in accordance with the present invention.

Referring now to FIGS. 2a, 2b and 3, current sensor 10 is better illustrated. The sensor 10 is to be connected in series with the input electrical supply power line 6. The current sensor 10 includes a current carrying bus bar 12 and current sensing circuitry 14 associated with the bus bar.

Looking at FIGS. 2a and 2b, the bus bar 12 is better illustrated. As can be seen, the bus bar 12 has apertures 16 at its opposed ends to facilitate the connection of the bus bar 12 to the electrical supply power line 6. A slot 18 is formed through the bus bar near its midpoint. The slot 18 is generally parallel to but is offset from the central longitudinal axis of the bus bar to divide the central portion of the bus bar into a pair of electrically parallel current carrying paths $I_1$ and $I_2$ respectively. Because the slot 18 is offset from the central longitudinal axis of the bus bar, the current carrying paths $I_1$ and $I_2$ have different cross-sectional areas $A_1$ and $A_2$ respectively. Thus, current flow through the two paths differs since current flow through a conductor is a function of the cross-sectional area of the conductor. A sensor accommodating recess 20 is provided in each current carrying path.

FIGS. 2b and 3 best illustrate the current sensing circuitry 14. Circuitry 14 includes a pair of magneto-resistive sensors 30a and 30b, each of which is accommodated in one of the recesses 20. The sensor 30a accommodated in the recess 20 formed in the smaller of the two current carrying paths ($I_1$) is more sensitive than the sensor 30b accommodated in the recess 20 formed in the larger of the two current carrying paths ($I_2$).

Associated with the two magneto-resistive sensors 30a and 30b are sensor circuits 32 and 34 respectively. Sensor circuit 32 includes an operational amplifier (op-amp) 40 having its inverting terminal connected to a reference voltage $V_{REF}$ by way of a resistor $R_1$. The non-inverting terminal of the op-amp 40 leads to a positive bias terminal of the magneto-resistive sensor 30a. The output of the op-amp 40 is fed back to its inverting and non-inverting terminals by way of resistors $R_2$ and $R_3$ respectively. Another op-amp 42 has its inverting terminal connected to a positive signal terminal of the magneto-resistive sensor 30a. The non-inverting terminal of the op-amp 42 is coupled to ground while the output of the op-amp 42 is fed to the negative bias terminal of the magneto-resistive sensor 30a.

The negative signal terminal of the magneto-resistive sensor 30a leads to the inverting terminal of an op-amp 44 byway of a resistor $R_4$. The non-inverting terminal of the op-amp 44 is connected to ground by way of resistor $R_5$ as well as to the connection between the inverting terminal of op-amp 42 and the positive signal terminal of sensor 30a by way of resistor $R_6$. The output of the op-amp 44 is fed back to its inverting terminal by way of resistor $R_7$.

The output of op-amp 44 is also applied to the non-inverting terminal of an op-amp 46 as well as to the input terminal of a CMOS bilateral switch $SW_1$. The output of op-amp 46 leads to one terminal of a diode $D_1$. The output of diode $D_1$ is fed back to the inverting terminal of op-amp 46. A capacitor $C_1$ is connected between the output of diode $D_1$ and ground. A rheostat $R_v$ is in parallel with capacitor $C_1$ and likewise is connected between the output of diode $D_1$ and ground. The op-amp 46, diode $D_1$, capacitor $C_1$ and the rheostat $R_v$ constitute a high input impedance non-inverting peak detector.

The rheostat $R_v$ is also connected to the bias terminal of a bilateral switch $SW_2$ which has its input terminal connected to ground and its output terminal connected to a terminal of a resistor $R_8$. The other terminal of resistor $R_8$ is connected to a positive voltage source $V_p$. A resistor $R_9$ is connected between voltage source $V_p$ and the output terminal of a bilateral switch $SW_3$. Bilateral switch $SW_3$ has its input terminal connected to ground and its bias terminal connected to the output terminal of bilateral switch $SW_2$.

The bilateral switch $SW_1$ has its bias terminal also connected to the output terminal of bilateral switch $SW_2$ and has its output terminal connected to the inverting terminal of a summing op-amp 48 byway of a resistor $R_{LOW}$. The non-inverting terminal of op-amp 48 is connected to ground by way of a resistor $R_{18}$. The output of op-amp 48 is fed back to its inverting terminal by way of a resistor $R_{19}$ as well as to an output node $V_{OUT}$.

The sensor circuit 34 connected to magneto-resistive sensor 30b is similar to the sensor circuit 32. Sensor circuit 34 includes an op-amp 50 having its inverting terminal connected to the reference voltage $V_{REF}$ by way of a resistor $R_{10}$. The non-inverting terminal of the op-amp 50 leads to a positive bias terminal of the magneto-resistive sensor 30b. The output of the op-amp 50 is fed back to its inverting and non-inverting terminals by way of resistors $R_{11}$ and $R_{12}$ respectively.

Another op-amp 52 has its inverting terminal connected to a positive signal terminal of the magneto-resistive sensor 30b. The non-inverting terminal of the op-amp 52 is coupled to ground while the output of the op-amp 52 is applied to the negative bias terminal of the magneto-resistive sensor 30b. The negative signal terminal of the magneto-resistive sensor 30b leads to the inverting terminal of an op-amp 54 by way of a resistor $R_{14}$. The non-inverting terminal of the op-amp 54 is connected to ground by way of resistor $R_{15}$ as well as to the connection between the inverting terminal of op-amp 52 and the positive signal terminal of sensor 30b byway of resistor $R_{16}$.

The output of the op-amp 54 is fed back to its inverting terminal byway of resistor $R_{17}$ and is also applied to the input terminal of a bilateral switch $SW_4$. The output terminal of bilateral switch $SW_4$ leads to the inverting terminal of op-amp 48 by way of a resistor $R_{HIGH}$. The bias terminal of bilateral switch $SW_4$ is connected to the output terminal of bilateral switch $SW_3$.

In operation, with the current sensor 10 connected in series with the input electrical supply power line 6, as current flows through the bus bar 12, the amount of current that flows through each of the current carrying paths $I_1$ and $I_2$ differs due to the different cross-sectional areas $A_1$ and $A_2$ respectively of the paths. The current flow through the two paths is detected by the magneto-resistive sensors 30a and 30b in the recesses 20. The magneto-resistive sensors 30a and 30b are biased by the op-amps (sensor 30a by op-amps 40 and 42 and sensor 30b by op-amps 50 and 52) in a manner so that the sensing circuit 32 associated with the smaller current path $I_1$ is sensitive to small current flow through the bus bar 12 and so that sensing circuit 34 associated with the larger current path $I_2$ is sensitive to larger current flow above a threshold level. Therefore, when current flow through the bus bar 12 is small and is below the threshold level, the sensor circuit 34 connected to the magneto-resistive sensor 30b generates no output. The sensor circuit 32 associated with the magneto-resistive sensor 30a however, generates an output voltage which is supplied to op-amp 48 before being output to the output node $V_{OUT}$.

When the current flow through the bus bar is below the threshold level, the output of the high input impedance non-inverting peak detector applied to the bias terminal of bilateral switch $SW_2$ through rheostat $R_v$ is such so as to maintain bilateral switch $SW_2$ off. When bilateral switch $SW_2$ is off, the bias terminal of bilateral switch $SW_1$ is connected to voltage source $V_p$ through resistor $R_8$ turning it on. The bias terminal of bilateral switch $SW_3$ is also connected to voltage source $V_p$ through resistor $R_8$ turning it on. When bilateral switch $SW_3$ is on, the bias terminal of bilateral switch $SW_4$ is connected to ground through bilateral switch $SW_3$ keeping bilateral switch $SW_4$ off.

With bilateral switch $SW_1$ on and bilateral switch $SW_4$ off, the output of op-amp 44 is supplied to the inverting terminal of op-amp 48 by way of resistor $R_{LOW}$. The ratio of resistors $R_{LOW}$ and $R_{19}$ is such to take into account the fact that the current flow through current carrying path $I_1$ is a fixed proportion of the total current flow through the bus bar 12. Thus, op-amp 48 scales the input from op-amp 44 proportionally so that the voltage appearing on output node $V_{OUT}$ represents the total current flowing through the bus bar 12.

When the current through current carrying path $I_1$ increases to the point where sensor 30a begins to saturate, the output of the peak detector is such so as to turn bilateral switch $SW_2$ on. When bilateral switch $SW_2$ is on, the bias terminal of bilateral switch $SW_1$ is connected to ground turning it off. The bias terminal of bilateral switch $SW_3$ is also connected to ground turning it off. When bilateral switch $SW_3$ is off, the bias terminal of bilateral switch $SW_4$ is connected to voltage source $V_p$ through resistor $R_9$ thereby turning it on.

With bilateral switch $SW_1$ off and bilateral switch $SW_4$ on, the output of optamp 54 is connected to the inverting terminal of op-amp 48 by way of resistor $R_{HIGH}$. The ratio of resistors $R_{HIGH}$ and $R_{19}$ is such to take into account that the current flow through current carrying path $I_2$ is a fixed proportion of total current flow through the bus bar 12. Thus, the output of op-amp 54 is scaled proportionally so that the output voltage of op-amp 48 appearing on output node $V_{OUT}$ is proportional to the total current flow through the bus bar 12.

The output voltage on node $V_{OUT}$ is supplied to the processor 8 which also receives an output voltage proportional to the line voltage of supply power line 6 from voltage sensor 4. The processor 8 in turn calculates the consumed electrical power based on these inputs.

Figure 4:
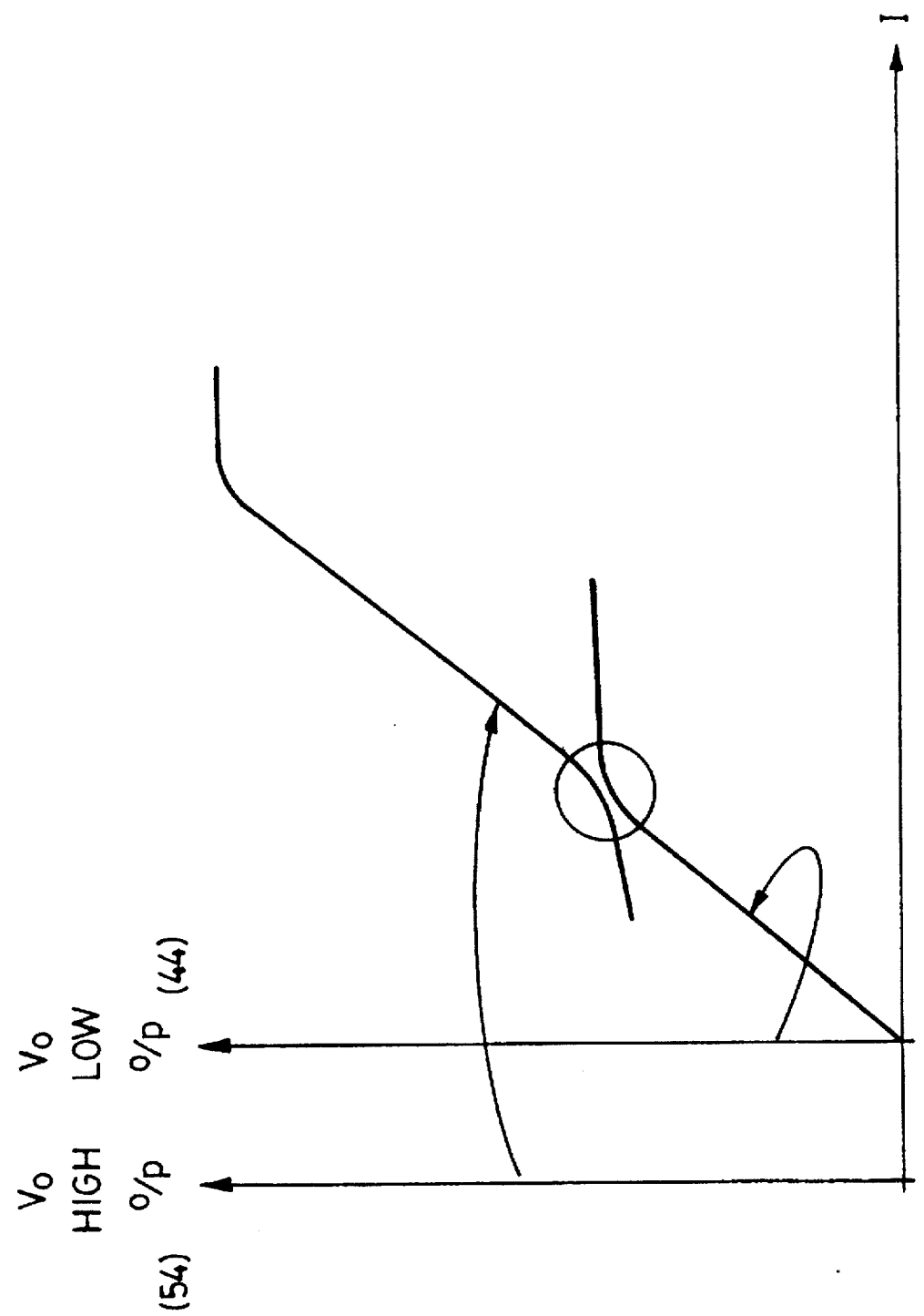
FIG. 4 is a graph illustrating characteristics of the current sensor of FIG. 3.

The peak detector is designed to have a fast attack time and a slightly slower decay time. This in combination with the setting of the switch points of the bilateral switches creates a small amount of hysteresis in the sensing circuitry to prevent oscillation in the sensing circuitry at the cross-overpoint i.e. the point at which bilateral switch $SW_1$ opens and bilateral switch $SW_4$ closes (see FIG. 4).

Although current sensor 10 has been described for use in an electrical power usage meter of the type disclosed in U.S. Pat. No. 4,902,965, it should be realized by those of skill in the art that the current sensor may be used in other types of electrical power usage meters as well as in basically any environment where current measurements need to be made.

As those of skill in the art will appreciate, the present invention allows accurate current measurements to be made by using sensors of different sensitivities each associated with a different current carrying path. It should also be realized that modifications and variations may be made to the present invention without departing from the scope thereof as defined by the appended claims.

I claim:

1. A current sensor comprising:
   a conductive bus bar having at least one generally longitudinal slot therein defining at least two electrically parallel current carrying paths in said bus bar, each of said current carrying paths having a different cross-sectional area so that current flow through said paths is different;
   a sensor associated with each of said current carrying paths to detect the flow of current therethrough; and
   a sensor signal processor associated with said sensors and receiving output therefrom, said sensor signal processor generating output proportional to the current flow through said bus bar using the output of the sensor associated with a smaller of said current carrying paths when current flow through said bus bar is below a threshold level.

2. A current sensor as defined in claim 1 wherein said sensor signal processor uses the output of the sensor associated with a larger of said current carrying paths to generate said output when the current flow through said bus bar reaches said threshold level.

3. A current sensor as defined in claim 1 wherein said slot is parallel to but offset from the central longitudinal axis of said bus bar.

4. A current sensor as defined in claim 3 wherein recesses are formed in each of said current carrying paths and wherein said sensors are accommodated in said recesses.

5. A current sensor as defined in claim 4 wherein said sensors are in the form of magneto-resistive devices.

6. A current sensor as defined in claim 2 wherein said sensor signal processor includes a pair of current sensing circuits, each associated with a different one of said sensors and a switch to connect the sensing circuit associated with the smaller current carrying path to an output node when the current flow through said larger current carrying path is below said threshold level and to connect the sensing circuit associated with the larger current carrying path to said output node when current flow through said larger current carrying path reaches said threshold level.

7. A current sensor as defined in claim 6 wherein said sensor signal processor further includes a peak detector coupled to the sensing circuit associated with the smaller current carrying path and actuating said switch when current flow through said larger current carrying path reaches said threshold level.

8. A current sensor as defined in claim 7 wherein said peak detector actuates said switch when the sensor associated with the smaller current carrying path reaches its saturation point.

9. A current sensor comprising:
   a current carrying bus bar to be connected in series with an input electrical power source, said bus bar having a slot therein defining a pair of electrically parallel current carrying paths each having a different cross-sectional area;
   a sensing device associated with each of said current carrying paths, one of said sensing devices being associated with a smaller of said current carrying paths and detecting current flow therethrough, a second of said sensing devices being associated with a larger of said current carrying paths and detecting current flow therethrough, said sensing devices generating output upon detection of current flow through said bus bar; and
   a sensor signal processor responsive to the output of the sensing device associated with said smaller current carrying path when current flows through said bus bar is below a threshold level and responsive to the output of the sensing device associated with the larger current carrying path when current flow through said bus bar reaches said threshold level, said sensor signal processor generating output proportional to current flow through said bus bar in response to the output of said sensing devices.

10. A current sensor as defined in claim 9 wherein said sensing devices are in the form of magneto-resistive sensors.

11. A current sensor as defined in claim 10 wherein said slot is parallel to but offset from the central longitudinal axis of said bus bar.

12. A current sensor as defined in claim 11 wherein recesses are formed in each of said current carrying paths and wherein said sensing devices are accommodated in said recesses.

13. A current sensor as defined in claim 9 wherein said sensor signal processor includes a pair of current sensing circuits, each associated with a different one of said sensors and a switch to connect the sensing circuit associated with the smaller current carrying path to an output node when the current flow through said larger current carrying path is below said threshold level and to connect the sensing circuit associated with the larger current carrying path to said output node when current flow through said larger current carrying path reaches said threshold level.

14. A current sensor as defined in claim 13 wherein said sensor signal processor further includes a peak detector coupled to the sensing circuit associated with the smaller current carrying path and actuating said switch when current flow through said larger current carrying path reaches said threshold level.

15. A current sensor as defined in claim 14 wherein said peak detector actuates said switch when the sensor associated with the smaller current carrying path reaches its saturation point.

16. An electrical power usage meter comprising:
   a current sensor measuring current flow through supply power lines, said current sensor including a conductive bus bar having at least one generally longitudinal slot therein defining at least two electrically parallel current carrying paths in said bus bar to be electrically connected in series with said supply power lines, each of said current carrying paths having a different cross-sectional area so that current flow through said paths is different; a sensing device associated with each of said current carrying paths to detect the flow of current therethrough; and a sensor signal processor associated with said sensing devices and receiving output therefrom, said sensor signal processor generating output proportional to the current flow through said bus bar using the output of the sensor associated with a smaller of said current carrying paths when current flow through said bus bar is below a threshold level;
   a voltage sensor measuring the voltage on said supply power lines; and
   logic responsive to said current and voltage sensors and generating output representative of the electrical power usage.

17. An electrical power usage meter as defined in claim 16 wherein said sensing devices are in the form of magneto-resistive sensors.

18. An electrical power usage meter as defined in clam 17 wherein said slot is parallel to but offset from the central longitudinal axis of said bus bar.

19. An electrical power usage meter as defined in claim 18 wherein recesses are formed in each of said current carrying paths and wherein said sensing devices are accommodated in said recesses.

20. An electrical power usage meter as defined in claim 16 wherein said sensor signal processor includes a pair of current sensing circuits, each associated with a different one of said sensors and a switch to connect the sensing circuit associated with the smaller current carrying path to an output node when the current flow through said larger current carrying path is below said threshold level and to connect the sensing circuit associated with the larger current carrying path to said output node when current flow through said larger current carrying path reaches said threshold level.

21. An electrical power usage meter as defined in claim 20 wherein said sensor signal processor further includes a peak detector coupled to the sensing circuit associated with the smaller current carrying path and actuating said switch when current flow through said larger current carrying path reaches said threshold level.

22. An electrical power usage meter as defined in claim 21 wherein said peak detector actuates said switch when the sensor associated with the smaller current carrying path reaches its saturation point.

\* \* \* \* \*